United States Patent
Chan et al.

[19]

[11] Patent Number: 6,160,672
[45] Date of Patent: Dec. 12, 2000

[54] MICROLENS PASSIVE ALIGNMENT APPARATUS AND METHOD OF USE

[75] Inventors: Benny L. Chan, Fremont; Stephen L. Kwiatkowski, Sunnyvale, both of Calif.

[73] Assignee: Blue Sky Research, San Jose, Calif.

[21] Appl. No.: 09/422,924

[22] Filed: Oct. 21, 1999

Related U.S. Application Data

[63] Continuation of application No. 09/162,455, Sep. 28, 1998, Pat. No. 6,078,437.

[51] Int. Cl.[7] .............................. G02B 7/02; G02B 13/18
[52] U.S. Cl. .......................... 359/819; 359/710; 359/719
[58] Field of Search .................................. 359/620, 623, 359/719, 710, 811, 819; 385/65, 33, 83, 88, 34; 372/101; 438/33, 56

[56] References Cited

U.S. PATENT DOCUMENTS

| | | | |
|---|---|---|---|
| 5,668,825 | 9/1997 | Karpinsky | 372/101 |
| 5,963,577 | 10/1999 | Snyder et al. | 372/101 |
| 6,078,437 | 6/2000 | Kwiatkowski | 359/719 |
| 6,088,168 | 7/2000 | Snyder | 359/668 |

*Primary Examiner*—Georgia Epps
*Assistant Examiner*—David N. Spector
*Attorney, Agent, or Firm*—LaRiviere, Grubman & Payne, LLP

[57] ABSTRACT

A method and apparatus for passively aligning microlenses and other optical elements and devices is disclosed herein. The method taught herein is particularly well suited to effect the passive alignment of cylindrical microlenses with other elements or devices, such as laser diodes. Cylindrical microlens structures formed in accordance with the principles of the present invention use a base substrate having one or more alignment sites. The alignment sites being formed using wafer scale fabrication techniques are formed with a high degree of precision, such that cylindrical microlenses fitted into the alignment sites are aligned with respect to each other and are positioned a proper optical distance from each other. These microlens structures can be constructed individually or constructed en masse enabling mass production of the microlens structures. Moreover, the microlens structures can be passively aligned with other optical elements. This can be effectuated by urging the optical element into intimate mechanical contact with an alignment member mounted on a microlens, thereby passively aligning the optical element with the microlens structure. This enables the fabrication of micro-optical devices using a minimum of skilled labor and achieving a superior degree of optical perfection.

45 Claims, 15 Drawing Sheets

MICROLENS PASSIVE ALIGNMENT APPARATUS AND METHOD OF USE

RELATED APPLICATION

This application is a continuation of Patent Application Ser. No. 09/162,455 filed Sep. 28,1998, now U.S. Pat. No. 6,078,437, which is hereby incorporated by reference.

TECHNICAL FIELD

The present invention relates to a method and apparatus for mounting and aligning optical elements to electronic components. More, particularly the present invention teaches a method and apparatus for mounting and aligning microlenses to laser diodes. In particular the principles of the present invention teach the mounting of at least one cylindrical microlens onto specific prealigned locations situated on a base substrate to form microlens composite structures which are capable of passive alignment with other optical devices, in particular, laser diodes. The method and apparatus taught herein are particularly well suited the manufacture of virtual point source laser diodes.

BACKGROUND OF THE INVENTION

Semiconductor laser diodes are efficient sources of laser radiation. Laser diodes, or more properly, semiconductor lasers, are generally constructed according to well-known principles of semiconductor manufacturing technology. A discussion of these principles can be found in Richard R. Shurtz II, Semiconductor Lasers and LEDs in *Electronics Engineers' Handbook*, 3rd ed. (hereinafter "Shurtz") (Donald G. Fink and Donald Christiansen, eds. 1989) which is hereby incorporated by reference.

A difficulty in the present art is that semiconductor laser diodes emit highly divergent beam light beams. This presents problems in many applications. The divergence of the semiconductor laser diode's beam is caused by its exit aperture which is very narrow along one axis (the "fast" axis, which is defined to be perpendicular to the laser junction), and much wider along the orthogonal axis (the "slow" axis, which is defined to be parallel to the laser junction). These two axes correspond to the Y and X axes, as will be later explained. The cross section of the beam emitted along the fast, or Y, axis is highly divergent due to diffraction effects. In comparison, the wider aperture, defined along the X axis, emits a beam cross section that diverges only slightly.

In many applications it is advantageous to cause the beam divergence of the emitted light beam to become uniform in the X and Y axes. This is known as "circularizing" the output beam. Much research and effort has been directed towards this end. One particularly successful methodology has been to direct that beam through a particularly configured cylindrical microlens which circularizes the beam. Several patents and patent applications are directed towards the furtherance of this technology. For example, a device of an early type is taught in U.S. Pat. No. 4,731,772, as referenced in U.S. Pat. No. 5,050,153

A method for the fabrication of cylindrical microlenses of the type embodied in the present invention is taught in U.S. Pat. No. 5,155,631, which is hereby incorporated by reference. According the '631 reference, a preferred method for fabrication of cylindrical microlenses starts by forming the desired shape as a glass preform. The preform is then heated to the minimum drawing temperature of the glass, and an elongate fiber is drawn from it. The cross-sectional shape of the elongate fiber bears a direct relation to the shape of the preform from which it was drawn. Elongate strands of cylindrical microlens can be forming in this way. During the drawing process, the lens surfaces so formed become optically smooth due to fire polishing.

In order to collimate the beam produced by a laser diode, the invention taught in U.S. Pat. No. 5,081,639 teaches the mounting of a cylindrical lens optically aligned with the laser diode to provide a beam of collimated light from the Y axis of the diode. The laser diode assembly taught therein includes a diffraction-limited cylindrical lens having a numerical aperture greater than 0.5 which is used to collimate a beam from a laser diode. A collimated beam is one which is neither converging nor diverging; i.e., the rays within the beam are traveling substantially parallel to one another.

U.S. Pat. No. 5,181,224 illustrates the use of cylindrical lenses to (inter alia) create a slowly diverging beam light. This lens may be said to be "circularizing" and, when installed on any of a variety of laser diodes is available as the "CIRCULASER7" diode available from Blue Sky Research in San Jose, Calif.

The U.S. patent application Ser. No. 08/837,002, entitled "MULTIPLE ELEMENT LASER DIODE ASSEMBLY INCORPORATING A CYLINDRICAL MICROLENS", now U.S. Pat. No. 5,963,557 describes another diode/microlens system in which the microlens does not correct for astigmatism of the diode beam, but which is instead corrected downstream with another larger lens or other means. In this system, no active alignment is required to position the microlens adjacent to the laser diode facet, so automation of the process is rendered possible. However, other means are then required to correct for the astigmatism of the beam. These other means take the form of additional optical elements inserted into the beam emerging from the microlens.

U.S. Pat. No. 5,050,153 teaches a device related to the device taught in the '772 patent. In this teaching, the device is implemented as a semiconductor laser optical head assembly utilizing a tilted plate for astigmatism correction in place of the cylindrical lens taught in the '772 reference.

U.S. Pat. No. 5,844,723 ('723) teaches a diode/microlens assembly incorporating two microlenses which circularize and correct for astigmatism. Unlike prior technologies, the microlens assembly of the '723 patent uses microlenses to both circularize and correct for astigmatism. Unlike the present invention, the lenses taught in the '723 patent are a crossed pair of cylindrical microlenses attached to a substrate which is mounted a laser diode chip. The two '723 microlenses are mounted in a crossed-T conformation orthogonal to each other with their flat surfaces facing the emitting facet of the diode, this arrangement requires no additional lenses for astigmatism correction. The crossed pair of lenses can collimate or focus the laser diode beam, for example focusing the beam into a single mode fiber. A difficulty with the crossed pair configuration is the relative difficulty in correctly aligning the lens pairs. Alignment in the crossed-T conformation can not presently be achieved using passive alignment.

To overcome the loss of optical efficiencies inherent in each of these designs, U.S. Pat. No. 5,181,224 addresses the problem by using a single specially constructed cylindrical microlens which circularizes and corrects the astigmatism in the output beam of a semiconductor laser diode. However, to obtain these advantages, this lens must be aligned to tolerances less than 2 microns along at least one axis. This precision alignment has heretofore required the active alignment of the lens with the diode. The resultant apparatus, e.g., the previously discussed CIRCULASER, is a low-divergence, low numerical aperture, highly efficient semiconductor laser diode assembly, with properties unmatched by other laser diodes. It should be noted that each of the above referenced patents are hereby incorporated by reference.

While the previously discussed laser diode assemblies are fully effective for their intended use, the method of their manufacture has heretofore resulted in manufacturing inefficiencies. In any optical system, the alignment of the various optical elements is critical to the functioning of the system. This is certainly the case where a cylindrical microlens is incorporated into an optical system with a laser diode to provide a low-cost source of collimated light. As is typical of many optical applications, there are six degrees of freedom inherent in the positioning of the lens with respect to the laser diode, as shown in FIG. 1. Having reference to that figure, a cylindrical microlens, 100 is shown. The lens has three axes, X, Y and Z. The Z axis, 1, corresponds to the optical axis of the optical system. The X, 3, axis is transverse to the Z axis, 1, in the horizontal plane. The Y, 2, axis is also perpendicular to the Z axis but in the vertical direction. Positioning the lens along the X, Y, and Z axes defines the first three degrees of freedom. Furthermore, the lens may be rotated about each of these axes as shown at 10, 20, and 30, and each of these rotations also defines a degree of freedom with regard to alignment of the lens in the optical system. For cylindrical lenses, placement of the lens along the X axis, 3, is often not critical. In summary, the accurate alignment of a cylindrical microlens with respect to a semiconductor laser diode often requires precise alignment of one with the other with respect to five degrees of freedom.

A fairly typical active alignment methodology generally proceeds as follows: First, a section of cylindrical microlens is mounted on a small mounting bracket which is mounted to a fixture having the ability to be adjusted in the required degrees of freedom. The microlens is then optically positioned and affixed to the semiconductor laser diode. In order to perform these alignments, a laser diode, usually the diode to which the lens will ultimately be assembled, is energized and the diode's laser beam directed through the lens onto a screen or optical sensor. The operator manipulates the lens along and about the several axes until the projected beam meets the required specifications for the assembly. In this manner, movement along the several axes, as well as rotation about those axes is manipulated by an operator who assembles each lens and laser diode. The entire operation is very dependent on the skill of the operator, as the optical cement utilized to affix the lens to the diode introduces a variable into the problem. This variable is engendered by the fact that the surface tension of the cement between the several elements on which it is used causes motion between those elements. This motion of course tends to misalign the optical elements. Active alignment methodologies are generally utilized to produce the devices taught in U.S. Pat. Nos. 5,081,639 and 5,181,224.

The term passive alignment, as used herein, defines a process whereby the lens is aligned with respect to another device solely by mechanical means and thereafter secured in position with respect to the diode or other device. Examples of such mechanical means include mechanical jigs, fixtures, alignment blocks, and the like. Passive alignment does not require the projection of a beam of light through the lens, nor indeed manipulation of the lens with respect to beam alignment or performance. Passive alignment relies solely on the mechanical alignment of the lens with respect to the diode or other device to achieve the required optical alignment.

The term "semi-passive alignment", as used herein, defines an alignment methodology whereby the lens is aligned with respect to another device along at least one degree of freedom solely by mechanical means, i.e., passively. Examples of such mechanical means include mechanical jigs, fixtures, alignment blocks, and the like. Passive alignment does not require the projection of a beam of light through the lens, nor indeed manipulation of the lens with respect to beam alignment or performance. Passive alignment relies solely on the mechanical alignment of the lens with respect to the diode or other device to achieve the required optical alignment. Alignment with respect to one or more of the other degrees of freedom, where required, is effected by an active alignment scheme. The passive and active alignment steps in a semi-passive alignment methodology may be performed in any order.

Preferably, an ideal semi-passive alignment scheme performs the passive portion of the alignment along the most critical degree of freedom. This is often the alignment along the Z-axis. After all alignment is completed, the lens is secured in position with respect to the other device.

What is further needed is an apparatus and methodology enabling passive alignment of complex microlens structures with optical devices, such as laser diodes. Of particular value are apparatus' and methods capable of passively aligning laser diodes to microlens structures having at least one microlens. A particular need exists for apparatuses and methods for aligning two or more microlenses with respect to each other and additionally aligning this multilens structure to other devices, said alignment having tolerances of less than $2\mu$ (micron) with respect to one or more degrees of freedom, most particularly along the Z axis of the microlens structures or with respect to individual microlenses.

What is still further needed is a methodology for constructing such structures using passive alignment techniques while being relatively insensitive to changes in final microlens size resulting from pulling errors.

The several references made herein to reference works and to issued and pending patents is to show the state of the art at the time the present invention was made. These references are herewith incorporated by reference.

SUMMARY OF THE INVENTION

The present invention teaches the fabrication and use of a microlens structure or construct having a base substrate and at least one microlens placed and aligned thereon. The substrate may take several forms, but in the simplest form comprises a base piece having one or more alignment sites. The alignment sites being dimensioned and positioned such that the act of fitting and securing the microlenses into the alignment sites results in passively aligned microlenses which are aligned with respect to each other and spaced at a proper optical distance from each other. Additionally, these microlens constructs can be semi-passively or passively aligned with another device, for example, a laser diode.

Further, the present invention teaches the use of two parallel cylindrical microlenses for altering the divergence of a beam emitted by a laser diode and controlling the astigmatism in the beam.

Furthermore, a method of the present invention teaches a way of using a microlens master template to simultaneously fabricate a multiplicity of microlens constructs, each being capable of passive or semi-passive alignment with a multiplicity of diodes to mass produce a plurality of microlenses or microlens/diode combinations.

Microlens constructs fabricated in accordance with the principles of the present invention can be used to manufacture an individual microlens/diode combination or, in the alternative, can be used to fabricate a template having a plurality of diodes or other electrical devices in combination with a plurality of microlens constructs. This unitary whole may then be divisible into individual construct/diode pairs, or may include several diodes per microlens construct.

DETAILED DESCRIPTION OF THE INVENTION

Unlike the previously discussed processes and apparatuses whereby microlenses are individually actively aligned and mounted one at a time to individual laser diodes, the principles of the present invention comprehend the fabrication of a construct having a plurality of prealigned microlenses which may be passively aligned with a laser diode. Furthermore, the present invention comprehends the simultaneous construction of a plurality of constructs, each having a plurality of microlenses which may then be passively aligned with a plurality of laser diodes.

Figure 1:
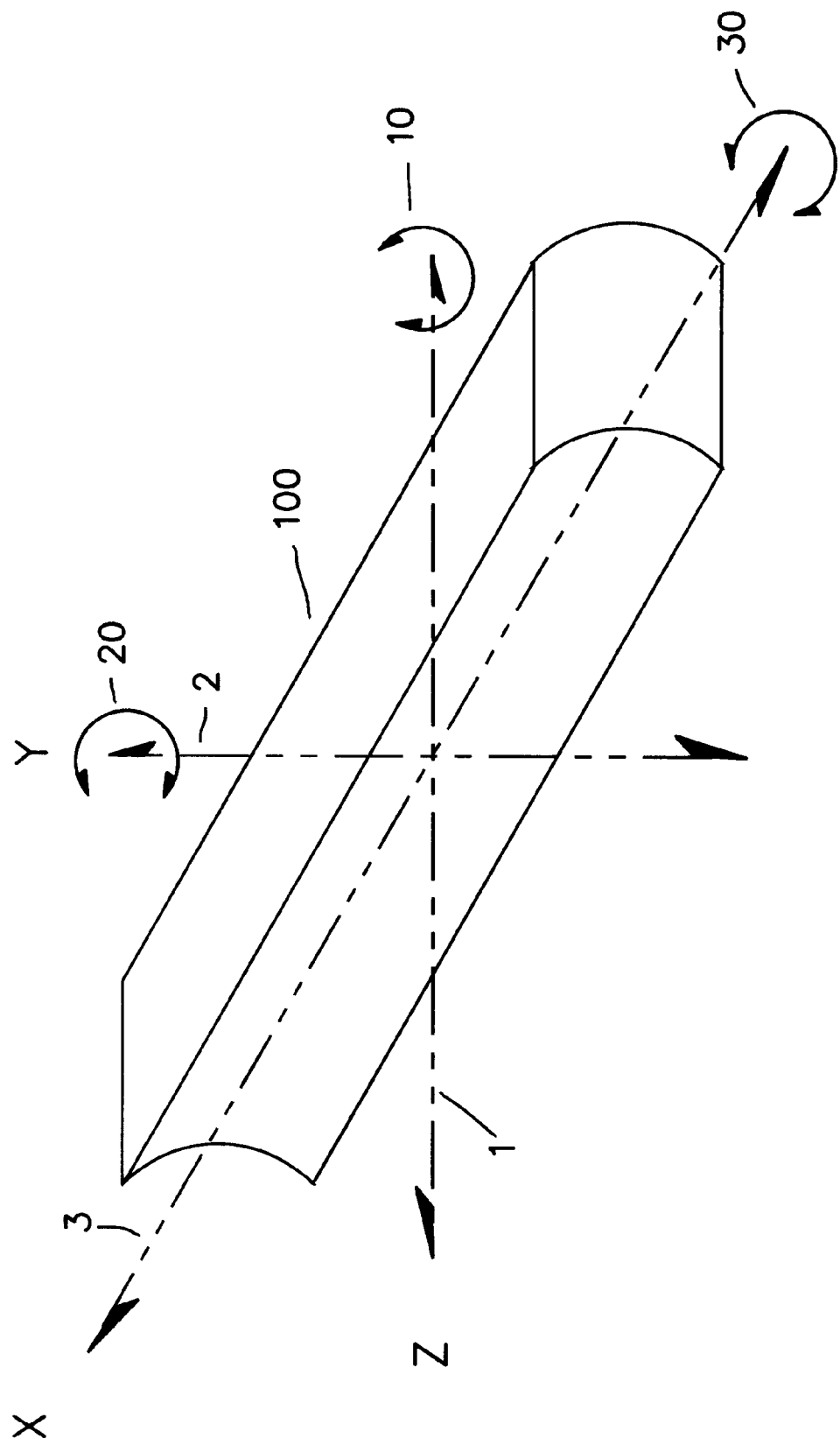
FIG. 1 is a depiction of the several axes defined by a cylindrical lens, and of the degrees of freedom inherent in these axes.
Figure 2:
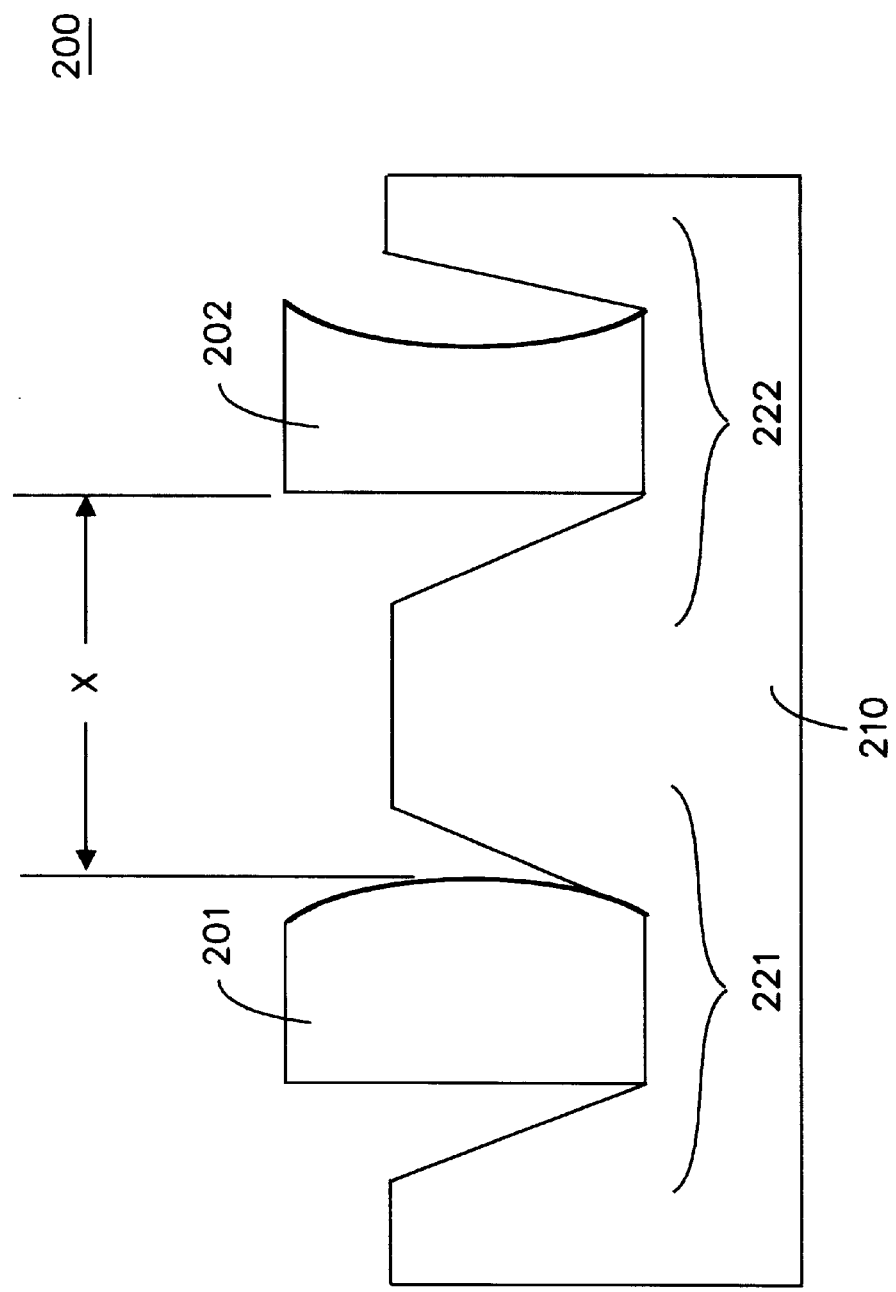
FIG. 2 is a cross-section view illustrating a two lens construct in accordance with the principles of the present invention.

The present invention advantageously comprehends a manufacturable microlens package in which two parallel lenses can be used control the degree of eccentricity in the resultant output beam and correct for the effect s of astigmatism. In one case the lens corrects the divergence of the laser diode input beam to create an output beam having an eccentricity of one (i.e. circularizing the input beam) and corrects for the effects of astigmatism. The lens pair may be used to correct the divergence of the input beam to any desired eccentricity, a circularized output beam being just one possibility. A difficulty in manufacturing multimicrolens constructs has always been the alignment of the microlenses with respect to each other and with respect to a laser diode. In the past, a multi-microlens co nfiguration required that each microlens be separately and actively aligned to the diode and to each other. This process is time consuming, requires highly trained personnel, and costs a great deal of money. A device constructed in accordance with the principles of the present invention avoids these difficulties by forming a base substrate which includes alignment sites. Cylindrical microlenses are mounted in the alignment sites, thereby enabling passive alignment of the lenses to each other and enabling subsequent passive alignment of the base substrate and the lenses to an optical device such as a laser diode. A basic illustration of the principles of the present invention is shown in FIG. 2. A microlens construct 200 incorporates a first microlens 201 and a second microlens 202 with a base substrate 210. The base substrate 210 is depicted with two alignment sites 221 and 222. It should be noted that a single alignment site may still be used to position the two microlenses. The alignment sites 221 and 222 are positioned such that microlenses 201 and 202 fitted into the alignment sites 221 and 222 are aligned with respect to each other and spaced apart a desired optical distance X. This distance varies depending on the lens pair design. In the case shown in FIG. 2, X is about 250 micron.

The base substrate 210 is typically constructed of a materials which may be subjected to ordinary semiconductor process techniques. A typical example is silicon. Silicon is advantageous because it is easily etchable to a high degree of precision using a wide variety of wafer scale semiconductor process techniques known to those having ordinary skill in the art. Due to the high precision obtainable by such techniques the shape size and dimensions of the alignment sites may be controlled to a high degree of accuracy. Such accuracy allows the sites to be aligned with respect to each other to a similar degree of accuracy.

The microlenses 201 and 202 themselves may be formed, for example, using the techniques set forth in U.S. Pat. No. 5,155,631. Once constructed the microlenses may be fitted into the precisely constructed and aligned alignment sites 221 and 222. Because the precision of ordinary semiconductor process techniques exceed the precision needed to align and space the microlenses, the precise formation of alignment sites enables highly precise alignment and spacing of microlenses. The microlenses are aligned merely by placing the microlenses into the sites.

Figure 3:
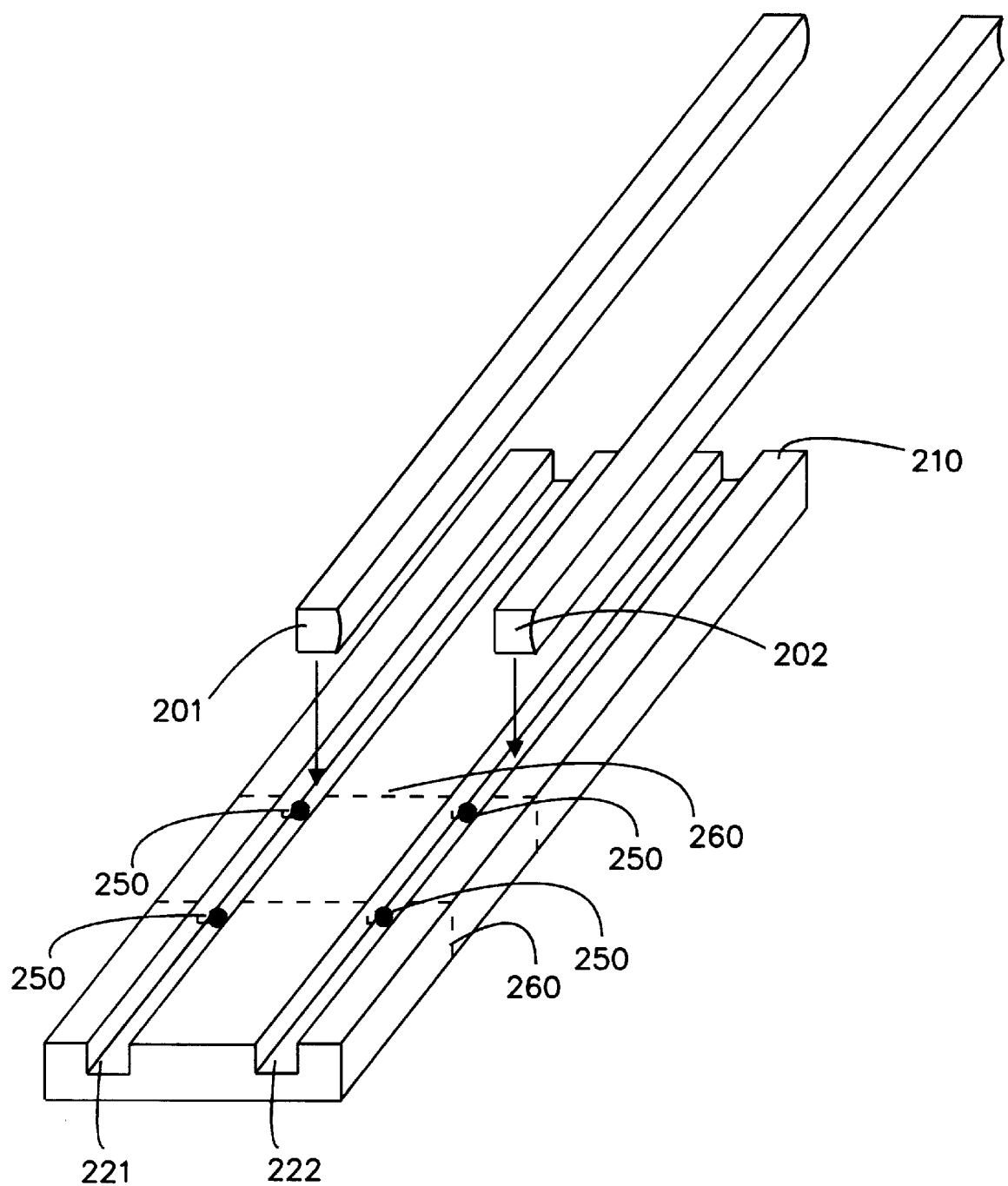
FIG. 3 is a perspective view showing two elongate microlens strands in readiness for placement in the alignment sites on a base substrate.

Referring to FIG. 3, elongate microlens strands 201 and 202 are placed in alignment sites 221 and 222, respectively.

The microlenses 201 and 202 are affixed to the base substrate 210 using any means known to those having ordinary skill in the art, for example, using adhesives such high temperature structural epoxies. By using long elongate cylindrical microlenses 201 and 202, and by placing adhesive at intermittent locations 250 along the elongate dimension of the microlenses 201 and 202 the lenses are secured to the base substrate 210. By cutting said base substrate 210 apart along lines 260, the substrate 210 can be segmented into several individual constructs 200. Each microlens construct 200 can be aligned with another optical element (not shown).

1. Best Mode

Figure 4:
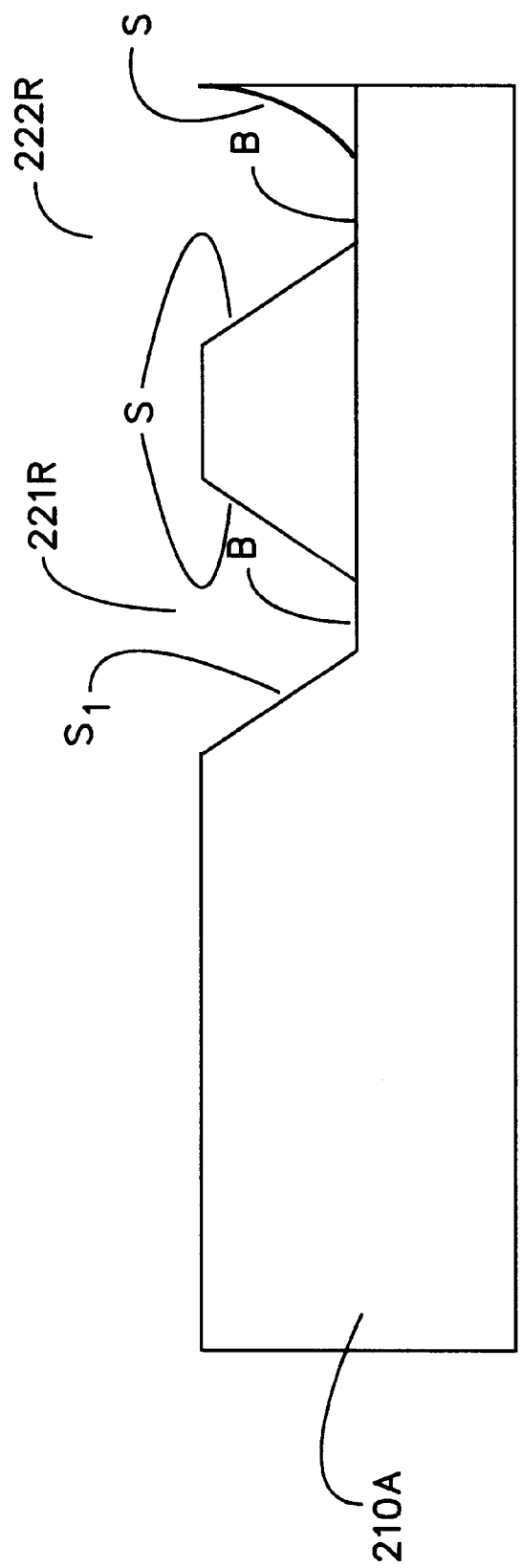
FIG. 4 is a cross-section view of a base substrate constructed in accordance with the principles of the present invention.
Figure 5:
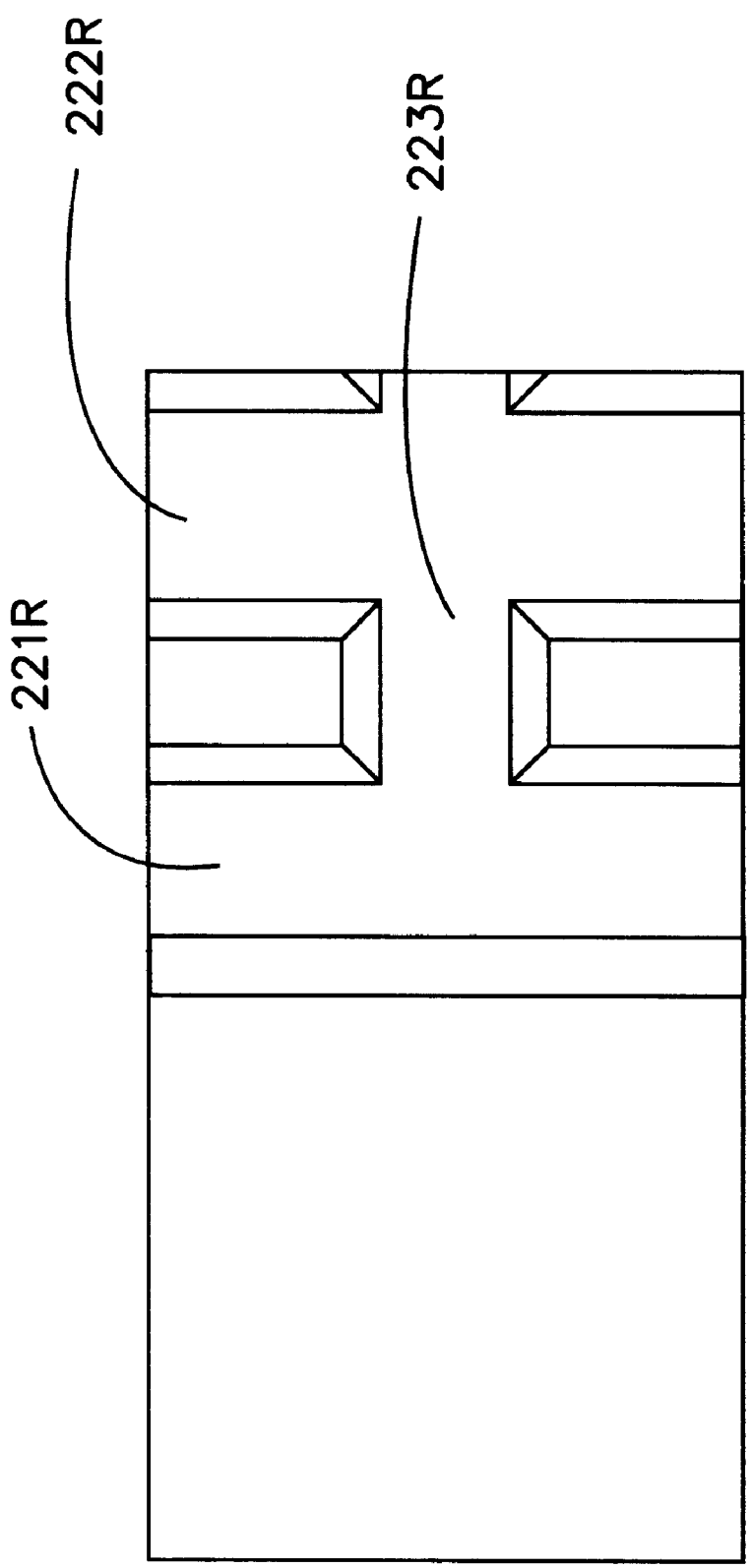
FIG. 5 is a plan view of a base substrate constructed in accordance with the principles of the present invention.

Referring to FIGS. 4 and 5, in accordance with the principles of the present invention, a base substrate 210A is formed. A first recess 221R and a second recess 222R, corresponding to the first alignment site 221 and second alignment site 222, respectively, are formed in the surface of the base substrate 210A. Typically, the recesses are formed using semiconductor etching techniques. Each recess 221A, 222A has side walls $S_1$, S, S, and S and a bottom surface B. Using wafer scale semiconductor fabrication techniques, the angle of the side walls S can be controlled to a high degree of precision which may be used to good advantage when securing microlenses in the recesses. Also, a transverse trench 223R may be etched into the base substrate 210A. The transverse trench 223R allows more room for a light beam (not shown) to pass this trench is alternatively referred to as an optical path.

Figure 6:
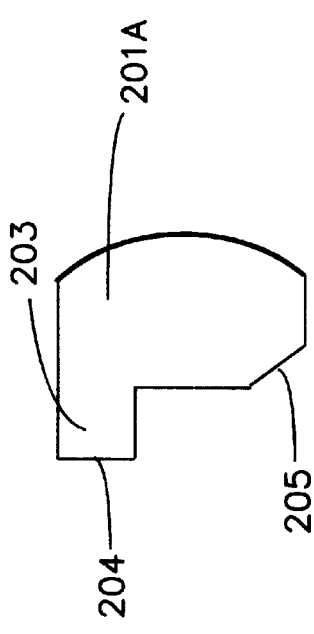
FIG. 6 is a cross-section view of a first microlens constructed in accordance with the principles of the present invention.

Referring to FIG. 6, a first microlens 201A is formed. A typical method being construction of a preform, heating the preform, drawing the preform, and cutting of a drawn strand having an appropriate length, as discussed above. The purpose of the first microlens 201A is to circularize (or create a beam of uniform divergence) an optical input beam. Such a beam may be produced by a laser diode (not shown). A particularly advantageous microlens, 201A shape is shown in FIG. 6. The microlens 201A including an alignment member 203 having an alignment flat 204. Additionally, the microlens 201A includes a contact edge 205. The surface of the contact edge 205 being at such an angle that when said microlens 201A is urged into contact with said recess 221R the contact edge 205 is in contact with, and coplanar to, the sidewall $S_1$.

Figure 7:
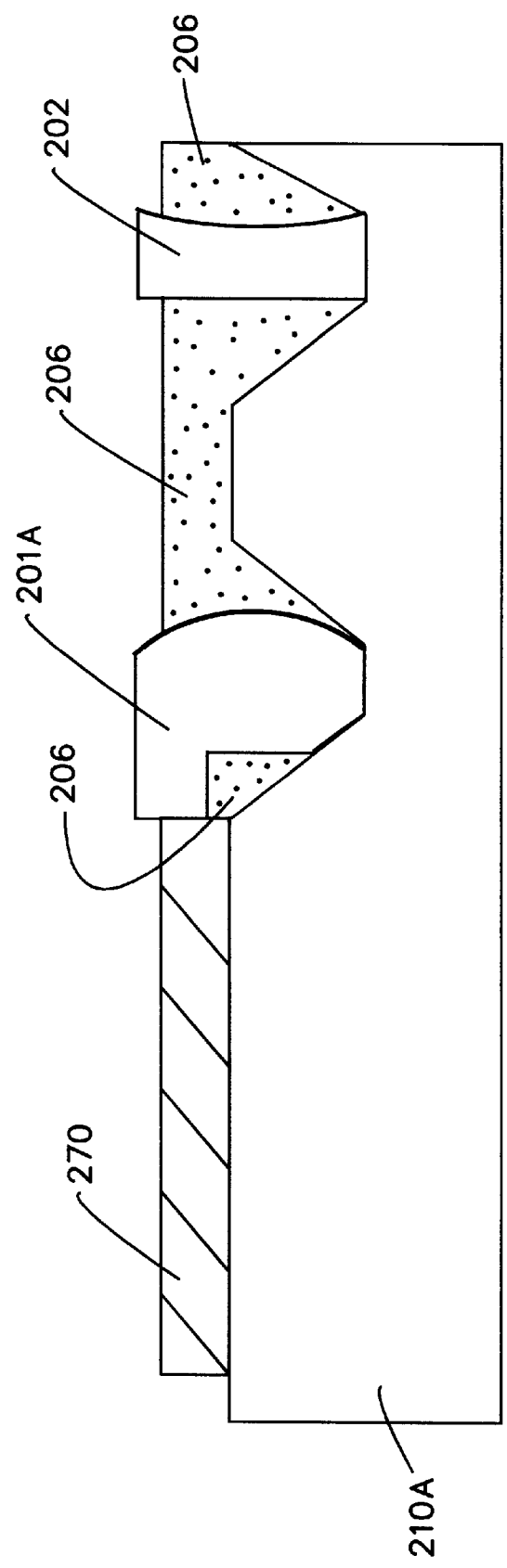
FIG. 7 is a cross-section view of a base substrate assembled having a first microlens, a second microlens, and a laser diode constructed in accordance with the principles of the present invention.
Figure 8:
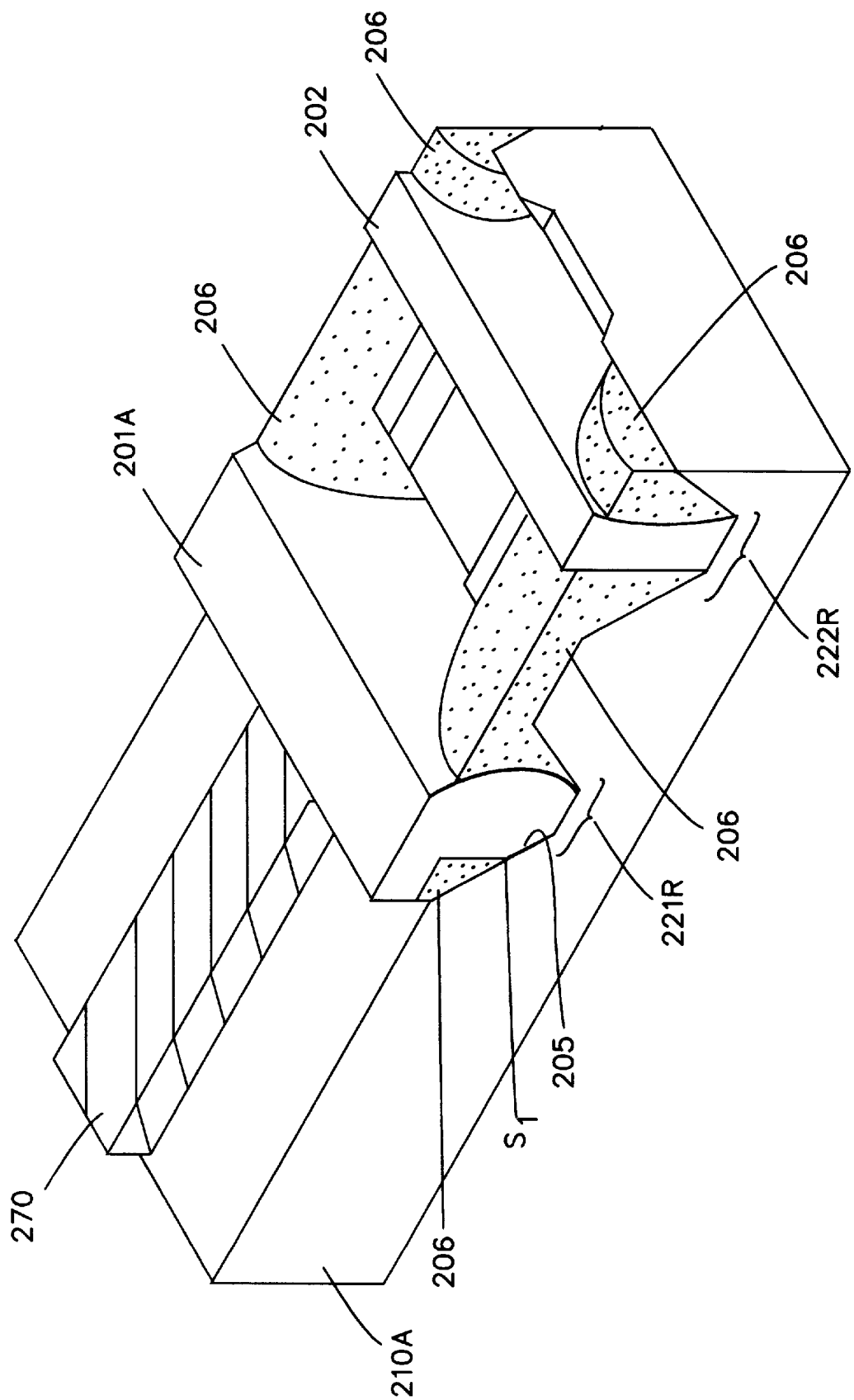
FIG. 8 is a perspective view of the construct apparatus shown in FIG. 7.

Once the base substrate 210A and the microlenses are formed, microlenses may be mounted in the recesses 221R, 222R. Referring to FIGS. 7 and 8, a first microlens 201A is placed in a first recess 221R. The contact edge 205 is contacted to sidewall $S_1$. and the bottom edge of the microlens 201A is contacted to the bottom surface B. This passively aligns the first microlens 201A with respect to the recess 221R (first alignment site). The microlens 201A is affixed to the substrate 210A using an adhesive 206. The second microlens 202 is positioned in the second recess 222R between the two sidewalls S. This passively aligns the second microlens 202 to the second recess 222R. Once placed, the second microlens 202 is also secured with adhesive 206. Due to the precision made possible using wafer scale semiconductor fabrication techniques the recesses 221R, 222R are precisely aligned to each other. Therefore, microlenses 201A, 202 placed in the recesses 221R, 222R are passively aligned with respect to each other. Thus a passively aligned microlens construct is formed. The second microlens 202 is typically used to correct astigmatism in an optical input beam (not shown).

With continued reference to FIGS. 7 and 8, an additional advantage of the present embodiment is the presence of the alignment member 203 on the first microlens 201A. A method of fabricating and using such alignment members is set forth in patent application Ser. No. 09/162,455 filed on Sep. 28, 1998. The presence of the alignment member 203 allows the entire construct 200 to be precisely and passively aligned with another optical element. For example, a laser diode 270. The alignment member 203 is particularly useful in precisely aligning the construct 200 with an optical element 270 along the Z-axis. Such optical elements 270 are typically laser diodes, but can be optical fibers or other optical elements. The flat 204 of the alignment member 203 is urged into physical contact with the emitting facet of the laser diode 270. In such an arrangement the length of the alignment member 203 defines the distance between the first microlens 201A and the emitting facet of the diode 270. The proper distance between the first microlens 201 and the diode 270 being determined by the needs of the output beam. For example, with continued reference to FIGS. 7 and 8, the first lens 201A in a plano-convex lens (where the convex lens is aspheric) is oriented with the flat surface towards the diode 270. The working distance is 30 microns. The thickness of the first lens 201A being about 220 microns. The thickness is defined as the distance from the flat surface to the vertex of the convex surface. This first lens 201A corrects; the shape of the diode laser beam in the fast axis. The second lens 202 is a plano-concave lens (the concave surface being aspheric) with a thickness of about 150 microns. The thickness of this lens being defined as the distance from the flat surface to the vertex of the concave surface. The second lens 202 corrects astigmatism in the diode beam. This lens combination produces a round beam with a low numerical aperature (about 0.11), an astigmatism of less than 0.25 waves, and a wavefront less than 0.25 wave peak to wave valley. The sag equation defining the aspheric surfaces:

$$z(r) = \frac{cr^2}{1 + \sqrt{1-(1+k)c^2r^2}} + a^2r^2 + a^4r^4 + a^6r^6$$

With the following coefficient for the Plano convex (201A)

| | | |
|---|---|---|
| c | 0 | (mm$^{-1}$) |
| k | −1 | |
| a$^2$ | −4.5588 | (mm$^{-1}$) |
| a$^4$ | −61.7042 | (mm$^{-3}$) |
| a$^6$ | 600.5568 | (mm$^{-5}$) |

And the following coefficient for the plano concave (202)

| | | |
|---|---|---|
| c | 21.7691 | (mm$^{-1}$) |
| k | −1 | |
| a$^2$ | −4.5588 | (mm$^{-1}$) |
| a$^4$ | −61.7042 | (mm$^{-3}$) |
| a$^6$ | 600.5568 | (mm$^{-5}$) |

Figure 9:
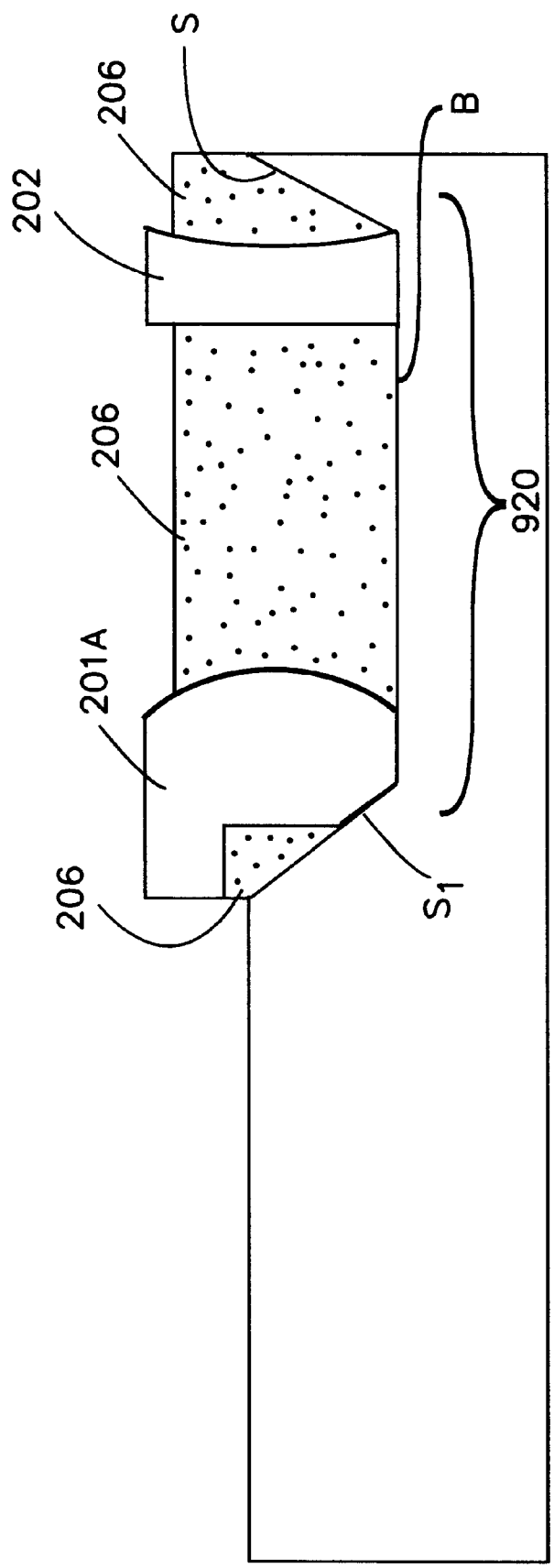
FIG. 9 is a cross-section view of an alternative embodiment of an apparatus constructed in accordance with the principles of the present invention.

FIG. 9 depicts another embodiment of a microlens construct 900 fabricated in accordance with the principles of the present invention. Construct 900 uses a single alignment site 920 into which two microlenses 201A, 202 may be fitted. The first microlens 201A can be fitted against a rear sidewall $S_1$ of alignment site 920. By urging the first microlens 201A against the sidewall $S_1$ a snug fit may be achieved allowing easy passive alignment of said first microlens 201A. Similarly, the second microlens 202 is aligned to a junction where the front side wall S of the alignment site 920 meets the bottom surface B of the alignment site 920. As with the first microlens 201A, the second microlens 202 is urged into physical contact with the junction. Both lenses are secured using adhesives 206.

In this way single microlens constructs can be formed to a high degree of precision which allows passive alignment with other optical devices. A further advantage of the methods and apparatus of the present invention is the ability to construct many microlens constructs at the same time. Each having a high degree of precision allowing passive alignment with other devices.

2. Method of Manufacture

Figure 10:
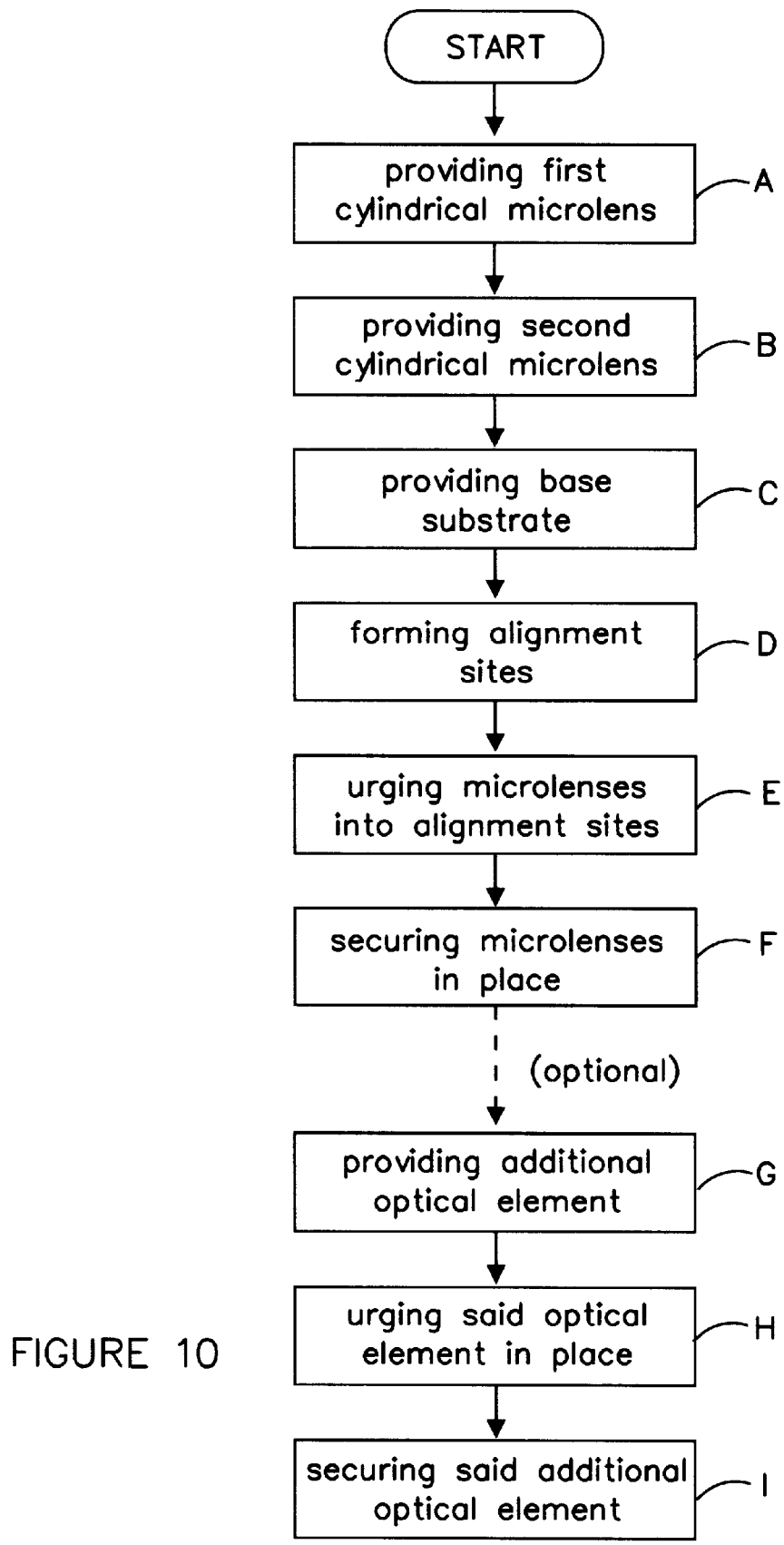
FIG. 10 is a diagrammatic flow chart showing a process for constructing an apparatus in accordance with the principles of the present invention.
Figure 11:
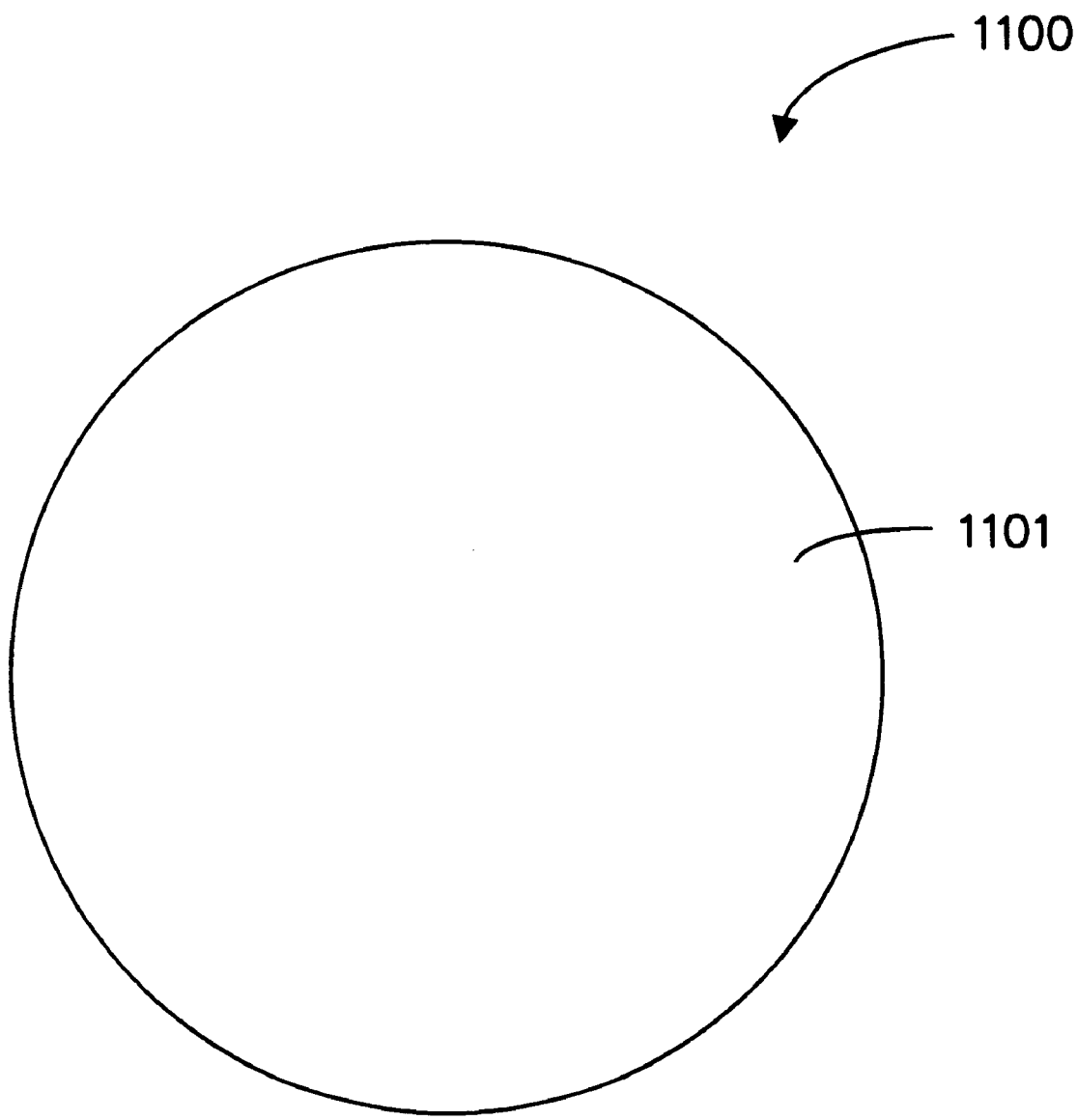
FIG. 11 is a plan view of a master base substrate for use in accordance with the principles of the present invention.

In accordance with the principles of the present invention a method for fabricating passively aligned microlens structures is hereby disclosed. With reference to FIG. 10, a first step, A, provides a first cylindrical microlens. Typically, these lenses are formed by methods known to those having ordinary skill in the art. Typically, these lenses are used to circularize the divergence of an input beam. Such lenses may also include alignment members. Step B includes providing a second cylindrical microlens. This second lens is typically used to correct astigmatism in the input beam. It should be noted that different lenses having different optical functions are contemplated by the invention. Additionally, embodiments having more microlenses or even one microlens are also contemplated by the present invention. In Step C, a base substrate is provided. Typically, the substrate is formed of silicon. However, other materials, including but not limited to, aluminum nitride or silicon carbide or other suitable materials for specific applications may be used. In Step D, alignment sites are formed. Each of the sites are shaped and sized so that microlenses may be placed in the sites enabling passive alignment through such placement. Typically, such alignment sites are formed by etching recesses into the substrate surface. However, the alignment sites may also be formed by cutting grooves into the substrate. These alignment sites may also be formed by stamping grooves into the substrate or other fabrication methods. Additionally, such alignment sites may be constructed by forming raised mesa structures. The alignment sites being defined between the mesas. The mesas being shaped and sized so that microlenses may be placed in the sites and contacted to the walls of the mesas enabling passive alignment through such placement. Typically, such mesas are constructed using semiconductor fabrication techniques, for example, thermally grown silicon dioxide mesas. Additionally, as needed, optical paths may be formed in the base substrate using semiconductor fabrication techniques. In Step E, microlenses are passively aligned by urging microlenses into contact with said alignment sites. In Step F, the microlenses are secured in place. Typically, adhesives are used to secure the microlenses. Typical adhesives are low cure temperature UV cured adhesives. High temperature polyamide epoxies or silver glasses being preferred. After securing with adhesives, a passively aligned multiple microlens construct is formed.

Optionally, this construct can form part of an electro-optic device by attaching the construct to another electronic or optical device, for example a laser diode. In Step G, an additional optical element is provided. Typical examples being fiber optic cables or laser diodes. In Step H, the additional optical element is aligned to said microlens structure by urging said additional optical element into contact with said first microlens. Additionally, this optical element can be passively aligned to the construct. In Step I, said additional optical element is secured to said microlens construct after alignment.

The alignment of the microlens construct to the additional optical element can be enhanced by passively aligned the microlens structure to the optical element. This can be effectuated advantageously by providing a first cylindrical microlens (in Step A) which includes an alignment member. Said alignment member having an alignment flat at one end. In Step H, said optical element is passively aligned by urging said optical element into intimate physical contact with the alignment flat of said alignment member, thereby passively aligning the optical element to the microlens structure.

3. Mass Production

The principles of the present invention contemplate a method and structure used to mass produce microlens constructs or construct/optical device combinations.

Referring to FIGS. 11–16, in accordance with the principles of the present invention a microlens master template 1100 is constructed. The template 1100 comprising a master base substrate 1101. The master base substrate 1101 may be constructed of a wide variety of materials. A particularly advantageous material is silicon due to its well studied properties as a semiconductor process material. However, a wide range other materials are satisfactory. The shape of the master base substrate 1101 is not critical to the practice of the invention. However, disk shaped substrates 1101 are preferred because of their ready obtainabilty. The master base substrate 1101 includes a plurality of substantially parallel alignment strips 1102, corresponding alternatively, to a plurality of first alignment sites and a plurality of second alignment sites.

Figure 12:
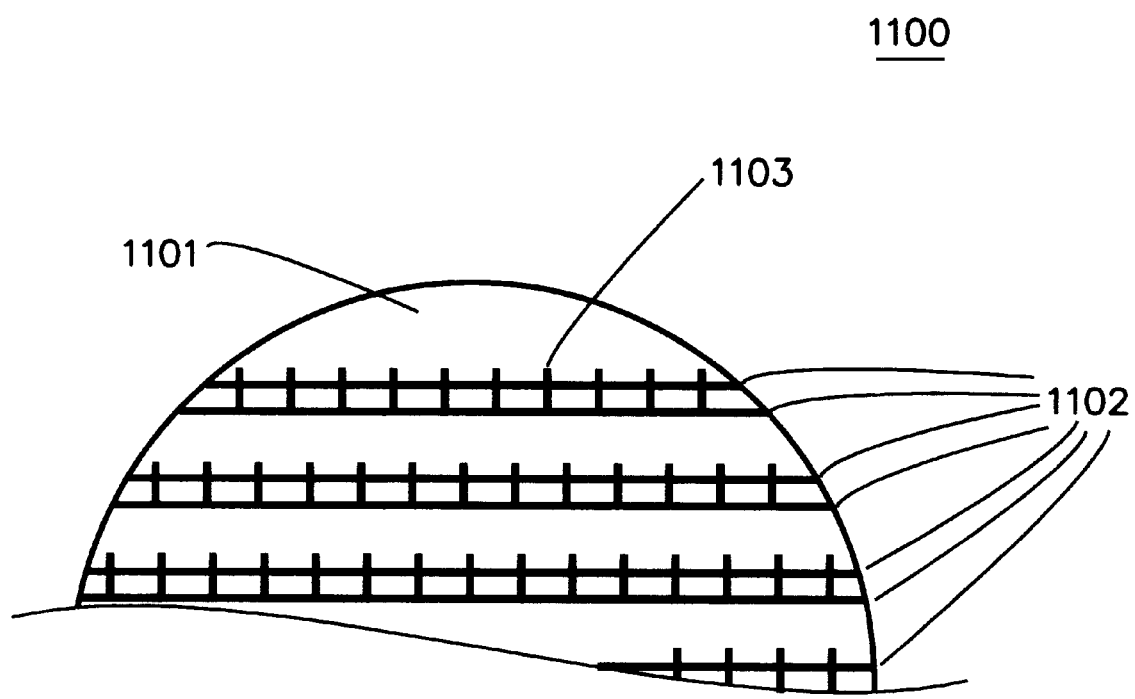
FIG. 12 is a plan view of a portion of a master base substrate having alignment strips and transverse optical paths formed thereon, in accordance with the principles of the present invention.

FIG. 12 is a cross-section view of a portion of a typical master base substrate 1101. The alignment strips 1102 are grooves (or recesses) which traverse the entire surface of the master base substrate 1101. These grooves 1102 may be etched in the master base substrate 1101 surface using ordinary semiconductor processing techniques, for example, by chemical etching. The grooves may also be formed using a precision saw blade to cut the grooves into the surface. Alternatively, long narrow mesas may be formed on either side of the alignment strips 1102. Either method defining long narrow and substantially parallel alignment strips 1102 (which correspond to alignment sites) across the surface of the master base substrate 1101. The master base substrate 1101 also includes a plurality of optical path strips 1103, said optical path strips 1103 being substantially perpendicular to said plurality of alignment strips 1102 and substantially parallel to each other.

Figure 13A:
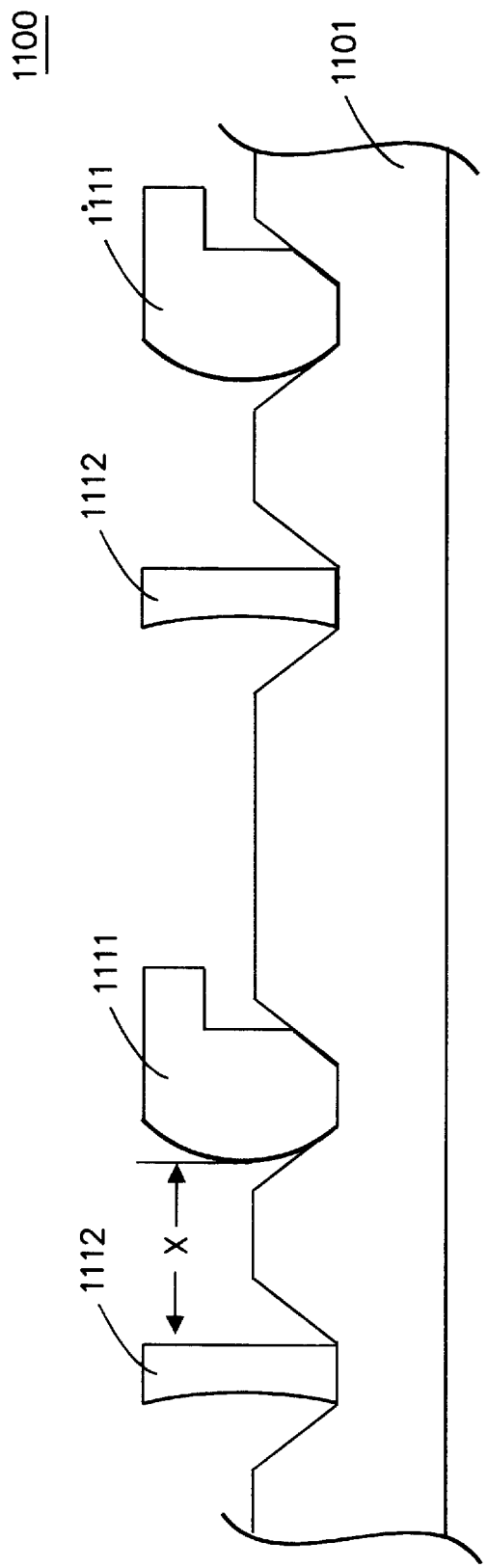
FIG. 13a is a cross-section view of a portion of a master base substrate having elongate microlenses placed in the alignment strips in accordance with the principles of the present invention.
Figure 13B:
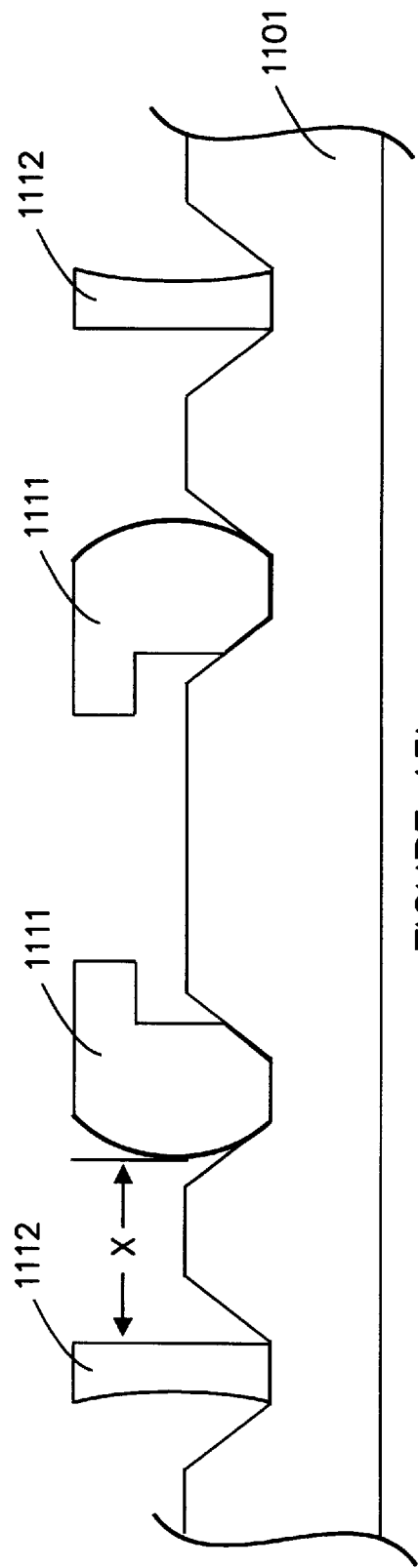
FIG. 13b is an alternative cross-section view of a portion of a master base substrate having elongate microlens placed in the alignment strips in accordance with the principles of the present invention.
Figure 14:
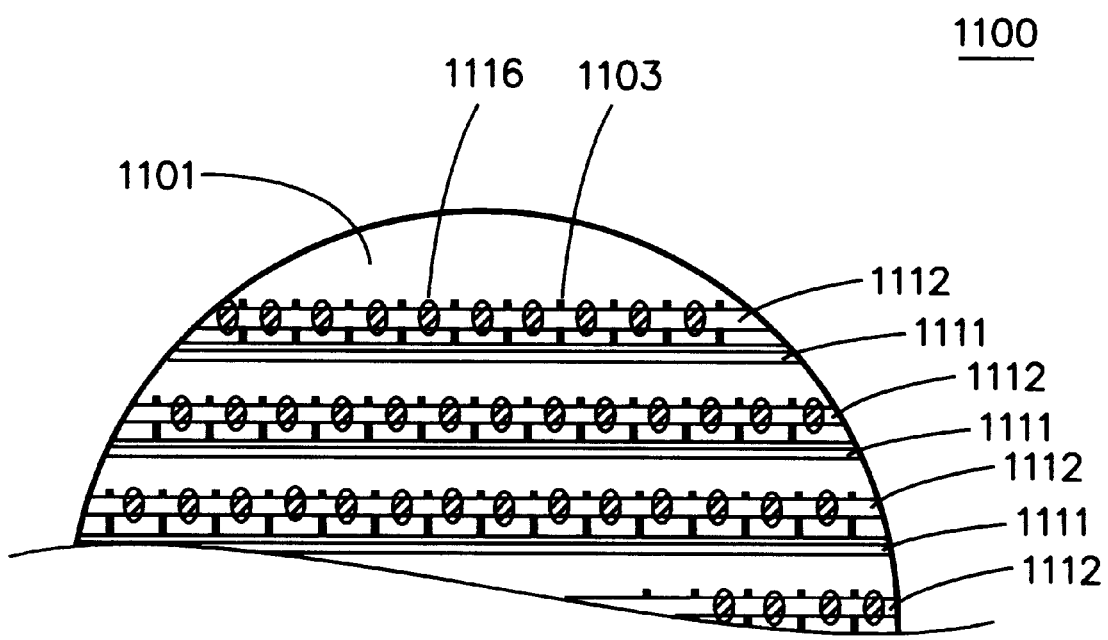
FIG. 14 is a plan view of the master base substrate of FIG. 13a including the intermittent adhesive locations.

Referring to FIGS. 13a and 14, rather than using individual microlenses, the master template 1100 uses long elongated strands of cylindrical microlens drawn from preforms. The length of these elongate microlenses is such that they span the entire length of the alignment strips 1102. A plurality of first elongate cylindrical microlenses 1111 is set into the appropriate alignment strips and passively aligned. A plurality of second elongate cylindrical microlenses 1112 is set into the appropriate alignment strips and passively aligned. Importantly, each of the plurality of first alignment sites is shaped and sized so that said plurality of first elongate microlenses 1111 may be urged into contact with, and thereby passively aligned to, said plurality of first alignment sites. Additionally, each of the plurality of second alignment sites is shaped and sized so that said plurality of second elongate microlenses 1112 may be urged into contact with, and thereby passively aligned to said plurality of second alignment sites. The distance X between each first elongate cylindrical microlens 1111 and each second elongate cylindrical microlens 1112, after being urged into contact with, and passively aligned to, their respective alignment sites, being a proper optical distance X and in correct alignment with respect to each other. As a result of such placement and passive alignment to the alignment sites, the elongate microlens strands 1111, 1112 are at a proper optical distance X and in correct alignment with respect to each other. The microlens strands 1111, 1112 can be affixed to the master base substrate 1101 by the application of adhesive 1116 at intermittent intervals along the elongate length of the elongate strands 1111, 1112. This completes construction of a typical microlens master template 1100. Such a template 1100 can be diced into many individual microlens constructs. Many different lens constructions are contemplated by the principles of the present invention, for example, that shown in FIG. 13*b*, wherein a different lens combination is used in the master template.

Figure 15:
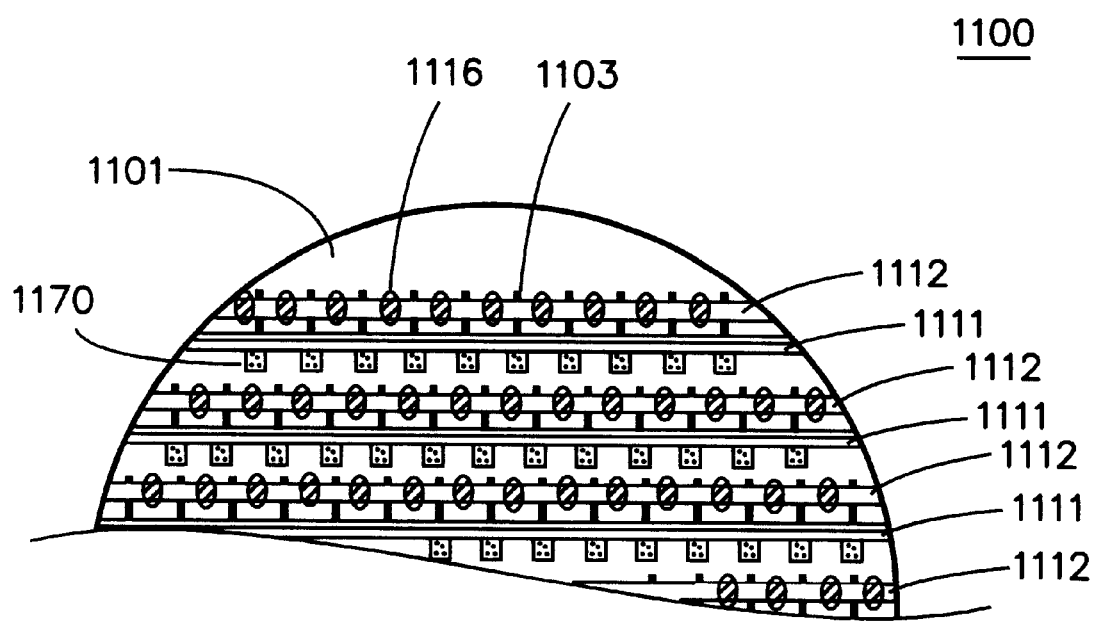
FIG. 15 is a plan view of the master base substrate of FIG. 14, also showing the addition of a plurality of laser diodes.

Additionally, as is shown in FIG. 15, optical devices 1170 (for example, laser diodes) may be formed or placed on the microlens master template 1100. These devices 1170 are positioned to project a light beam (not shown) through said first and second elongate microlenses 1111, 1112 along the path defined by the optical path strips 1103. Additionally, the devices 1170 can be passively aligned to the first elongate cylindrical microlens 1111. This is especially effective if the first elongate cylindrical microlens 1111 includes an alignment member. The optical device 1170 is passively aligned by contacting the device 1170 to the alignment member as previously disclosed. This template 1100 with optical devices 117) already aligned may then be diced into a plurality of passively aligned optical device/microlens constructs.

Figure 16:
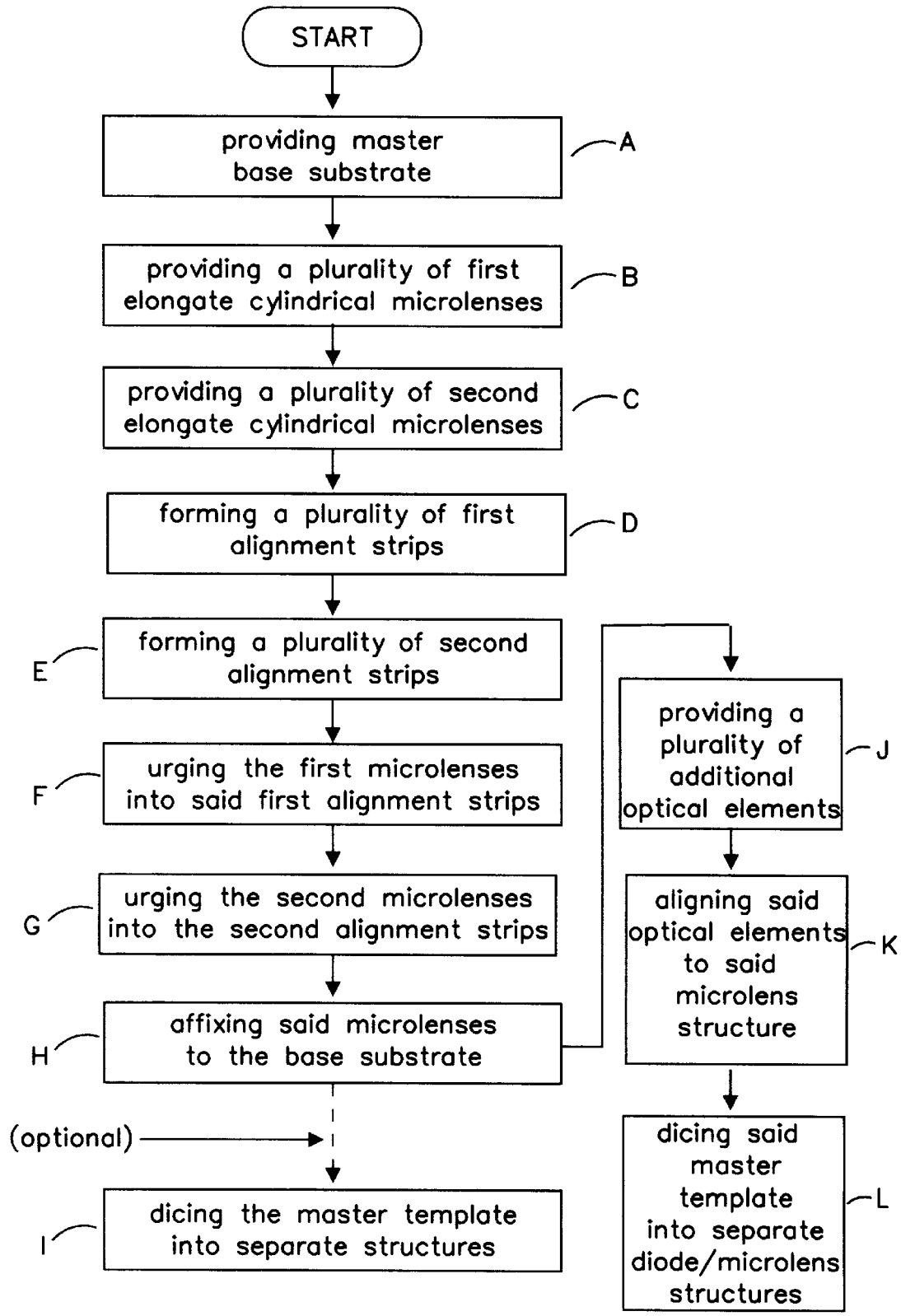
FIG. 16 is a diagrammatic flow chart showing a process for mass producing lens/diode constructs in accordance with the principles of the present invention.

With reference to the forgoing drawings, and in particular FIG. 16, in accordance with the principles of the present invention, a method for fabricating a plurality of passively aligned microlens structures is disclosed.

In a first Step A, a master base substrate 1101 is provided. In Step B, a plurality of first elongate cylindrical microlenses 1111 are provided. In Step C, a plurality of second elongate cylindrical microlenses 1112 are provided.

In Step D, a plurality of substantially parallel first alignment strips are formed, each strip corresponding to a plurality of first alignment sites. The first alignment strips being shaped and sized so that said plurality of first elongate microlenses 1111 may be urged into contact with, and thereby passively aligned to, said plurality of first alignment strips.

In Step E, a plurality of substantially parallel second alignment strips are formed, each second alignment strip being substantially parallel to said plurality of first alignment strips. Each of said plurality of second alignment strips being separated from a corresponding first alignment strip by a proper optical distance. Each of said plurality of second alignment strips are shaped and sized so that said plurality of second elongate microlenses 1112 may be urged into contact with, and thereby passively aligned to, said plurality of second alignment strips.

In Step F, said plurality of first elongate cylindrical microlenses 1111 is urged into contact with, and passively aligned to, said first alignment strips. In Step G, said plurality of second elongate cylindrical microlenses 1112 are urged into contact with said second alignment strips, thereby locating said first elongate cylindrical microlenses 1111 a proper optical distance from said second elongate cylindrical microlenses 1112 and correctly aligning said first elongate cylindrical microlenses 1111 with respect to said second elongate cylindrical microlenses 1112.

In Step H, each of said plurality of first elongate cylindrical microlenses 1111 and said plurality of second elongate cylindrical microlenses 1112 is affixed to said master base substrate 1101 at intermittent locations 1116 along the elongate dimensions of said first and second elongate cylindrical microlenses 1111, 1112 creating a microlens master template.

In Step I, the microlens master template may diced into separate microlens structure. This can be a final step. Alternatively, individual laser diodes may be aligned with each of the separate microlens structures. Such alignment can be passive or active.

Additionally, in Step J, while will occur prior to dicing Step I, a plurality of additional optical elements 1170 may be provided. In Step K, said plurality of additional optical elements 1170 are passively aligning with said microlens structures. This can be accomplished most efficiently if each of said first elongate cylindrical microlenses 1111 also includes an alignment member. The plurality of additional optical elements 1170 are each passively aligned by contacting the optical element 1170 to the alignment member of said first elongate cylindrical microlenses 1111. Once in place the optical element is secured. In Step L, the microlens master template with devices 1170 is diced into separate microlens/optical device structures.

It will be appreciated that many modifications can be made to the embodiments described above without departing from the spirit and the scope of the invention. In particular, it should be noted that many different microlens types and combinations may be used. Also many base substrate materials may be used in place of silicon, including but not limited to, aluminum nitride, silicon carbide, and copper tungsten.

The present invention has been particularly shown and described with respect to certain preferred embodiments and the features thereof. It is to be understood that the shown embodiments are the presently preferred embodiments of the present invention and, as such, are representative of the subject matter broadly contemplated by the present invention. The scope of the invention fully encompasses other embodiments which may become obvious to those skilled in the art, and are accordingly to be limited by nothing other than the appended claims, in which reference to an element in the singular is not intended to mean "one and only one" unless explicitly stated, but rather "one or more". All structural and functional equivalents of the elements of the above-described preferred embodiments that are known or later come to be known to those of ordinary skill in the art are expressly incorporated herein by reference and are intended to be encompassed by the present claims. Moreover, it is not necessary for a device or method to address each and every problem solved by the present invention, for it to be encompassed by the present claims. Furthermore, no element, component, or method step in the present disclosure is intended to be depicted to the public regardless of whether the element, component, or method step is explicitly recited in the claims. No claim element herein is to be construed under the provisions of 35 U.S.C. '112, paragraph 6, unless the element is expressly recited using the phrase "means for".

The principles of the present invention also contemplate the passive alignment of other elements, for example, an optical element 1170, to the microlens master template to the already passively aligned microlenses. Additionally, the present invention contemplates the automated alignment and assembly of these microlenses or optical elements. In particular, the present invention contemplates the addition of a plurality of laser diodes.

What is claimed is:

1. A microlens structure for passively aligning microlenses, the structure comprising:

a first cylindrical microlens having at least one cylindrical optical surface;

a second cylindrical microlens having at least one cylindrical optical surface;

a base substrate having a surface, the base substrate surface having a first alignment site, shaped and sized so that said first microlens may be urged into contact with, and thereby passively aligned to, said first alignment site, the base substrate surface having a second alignment site, shaped and sized so that said second microlens may be urged into contact with, and thereby passively aligned to, said second alignment site, said first cylindrical microlens and said second cylindrical microlens, each being urged into contact with, and passively aligned to, their respective alignment sites, being separated by a proper optical distance and in correct alignment with respect to each others; and an optical axis, said optical axis being centered on and being perpendicular to the cylindrical optical surfaces of each of the first and second cylindrical microlenses, said optical axis being disposed in a plane parallel to said base substrate surface, said optical axis being perpendicular to said alignment sites on said base substrate surface, and whereby light traveling along said optical axis traverses each of said first and said second cylindrical microlens in series.

2. A microlens structure as in claim 1, wherein said alignment sites are recesses formed in said base substrate.

3. A microlens structure as in claim 2, wherein said alignment sites further include notches to allow a light beam to pass through said first cylindrical microlens and said second cylindrical microlens.

4. A microlens structure as in claim 3, wherein said structure is capable of passive alignment with another optical element.

5. A microlens structure as in claim 4, wherein said another optical element is aligned to said first cylindrical microlens.

6. A microlens structure as in claim 2, wherein the recesses forming the alignment sites are cut with a saw.

7. A microlens structure as in claim 1, wherein said alignment sites are formed using wafer scale fabrication techniques.

8. A microlens structure as in claim 1, wherein said alignment sites are defined by raised mesas formed on said base substrate and wherein said microlenses are placed and passively aligned between said mesas.

9. A microlens construct for passively aligning cylindrical microlenses, the construct comprising:

a base substrate having a surface, said base substrate surface having a first alignment site and a second alignment site;

a first cylindrical microlens having at least one cylindrical optical surface and being fitted into said first alignment site;

a second cylindrical microlens having at least one cylindrical optical surface and being fitted into said second alignment site; and an optical axis, said optical axis being centered on and being perpendicular to the cylindrical optical surfaces of each of the first and second cylindrical microlenses, said optical axis being disposed in a plane parallel to said base substrate surface, said optical axis being perpendicular to said alignment sites on said base substrate surface, and whereby light traveling along said optical axis traverses each of said first and said second cylindrical microlens in series.

10. A microlens construct as in claim 9, wherein said first microlens fitted into said first alignment site is optically aligned in at least on degree of freedom with respect to said second microlens fitted into said second alignment site.

11. A microlens construct as in claim 10, wherein said first microlens fitted to said first alignment site is separated from said second microlens fitted into said second alignment site by a proper optical distance.

12. A microlens construct as in claim 9, wherein said first alignment site and said second alignment site are recesses formed in the base substrate.

13. A microlens construct as in claim 12, wherein each of said recesses formed in the base substrate have side walls and a bottom surface and where said first microlens is urged into contact with the side walls and bottom surface of said first alignment site and where said second microlens is urged into contact with the side walls and bottom surface of said second alignment site.

14. A microlens construct as in claim 9, wherein said first alignment site and said second alignment site are defined by mesas formed on the base substrate.

15. A microlens construct as in claim 14, wherein each of said mesas have side walls and where said first microlens is urged into contact with the side walls of the mesas defining said first alignment site and where said second microlens is urged into contact with the side walls of the mesas defining said second alignment site.

16. A microlens construct as in claim 12, wherein said microlens construct is capable of passive alignment with another optical element.

17. A microlens construct as in claim 16, wherein said another optical element includes a laser diode.

18. A microlens construct as in claim 17, wherein said laser diode is capable of passive alignment with said construct by urging said diode into contact with said first microlens.

19. A microlens construct as in claim 18, wherein said first microlens includes an alignment member, the length of said alignment member being such that when said laser diode is urged into contact with said alignment member the diode is passively aligned with the microlens construct.

20. A microlens construct as in claim 9 wherein said first cylindrical microlens circularizes an input light beam as it passes through said first cylindrical microlens.

21. A microlens construct as in claim 20 wherein said second cylindrical microlens corrects for astigmatism in the input light beam as it passes through said second cylindrical microlens.

22. A microlens construct as in claim 21 wherein said first microlens includes an alignment member for passively aligning said construct with another optical device.

23. A microlens construct as in claim 22 wherein said alignment member includes a contact end which upon being urged into contact with said another device enables the passive alignment of the construct with the device with respect to at least one degree of freedom.

24. The microlens construct of claim 23 wherein the alignment member extends in a direction perpendicular to a focal plane of the construct.

25. The microlens construct of claim 24 wherein the distance the alignment member extends perpendicular to the focal plane of the construct is a function of the optical properties of the first microlens.

26. The microlens construct of claim 24 wherein the distance the alignment member extends perpendicular to the focal plane of the construct is a function of the size and shape of the first microlens.

27. A microlens construct as in claim 9 wherein said first microlens and said microlens are both drawn cylindrical microlenses.

28. A microlens master template used for the fabrication of a multiplicity of microlens structures, the master template comprising:

a master base substrate having a surface,
the master base substrate surface having a plurality of substantially parallel alignment strips, corresponding alternatively, to a plurality of first alignment sites and a plurality of second alignment sites;

a plurality of first elongate cylindrical microlenses,
each of said plurality of first elongate cylindrical microlenses having at least one elongate cylindrical optical surface;

a plurality of second elongate cylindrical microlenses,
each of said plurality of second elongate cylindrical microlenses having at least one elongate cylindrical optical surface, the plurality of first alignment sites, each being shaped and sized so that said plurality of first elongate microlenses may be urged into contact with, and thereby passively aligned to, said plurality of first alignment sites, the plurality of second alignment sites, shaped and sized so that said plurality of second elongate microlenses may be urged into contact with, and thereby passively aligned to, said plurality of second alignment sites, said plurality of first elongate cylindrical microlenses and said plurality of second elongate cylindrical microlenses, each being urged into contact with, and passively aligned to, their respective alignment sites, being separated by a proper optical distance and in correct alignment with respect to each other; and a plurality of optical axes,
said plurality of optical axes being centered on and being perpendicular to the cylindrical optical surfaces of each of the plurality of first and the plurality of second cylindrical microlenses,
said plurality of optical axes being disposed in a plane parallel to said master base substrate surface,
each of said plurality of optical axes being perpendicular to said respective alignment sites on said master base substrate surface, and
whereby light traveling along said plurality of optical axes traverses each of said plurality of first and said plurality of second cylindrical microlenses in series.

29. A microlens master template as in claim 28, wherein the master base substrate includes a plurality of substantially parallel optical path strips, said optical path strips being substantially perpendicular to said plurality of alignment strips.

30. A microlens master template as in claim 28, wherein said plurality of first elongate cylindrical microlenses each include an alignment member for passively aligning said plurality of first elongate cylindrical microlenses with a plurality of optical devices.

31. A microlens master template as in claim 30, wherein the length of said alignment member is such that when said plurality of optical devices are urged into contact with said alignment member the devices are passively aligned with said first elongate cylindrical microlenses.

32. A method for fabricating a passively aligned microlens structure, comprising the steps of:

a) providing a first cylindrical microlens having at least one cylindrical optical surface;
b) providing a second cylindrical microlens having at least one cylindrical optical surface;
c) providing a base substrate having a surface;
d) forming a first alignment site on the base substrate surface, said first alignment site shaped and sized so that said first microlens may be urged into contact with, and thereby passively aligned to, said first alignment site;
e) passively aligning said first microlens to said first alignment site by urging said first microlens into contact with said first alignment site;
f) securing said first microlens in place;
g) forming a second alignment site on the base substrate, said second alignment site shaped and sized so that said second microlens may be urged into contact with, and thereby passively aligned to, said first microlens;
h) passively aligning said second microlens to said first microlens by urging said second microlens into contact with said second alignment site; and
i) securing said second microlens in place, and thereby fabricating said microlens structure such that an optical axis is centered on and is perpendicular to the cylindrical optical surfaces of each of the first and second cylindrical microlenses,
said optical axis being disposed in a plane parallel to said base substrate surface,
said optical axis being perpendicular to said alignment sites on said base substrate surface, and
whereby light traveling along said optical axis traverses each of said first and said second cylindrical microlens in series.

33. A method for fabricating a passively aligned microlens structure as in claim 32, the method further comprising the steps of:

j) providing an additional optical element;
k) passively aligning said additional optical element to said microlens structure by urging said additional optical element into contact with said first microlens; and
l) securing said additional optical element to said microlens structure after said alignment.

34. A method for fabricating a passively aligned microlens structure as in claim 33, wherein said step a), of providing a first cylindrical microlens, includes providing a first cylindrical microlens having an alignment member, said alignment member having an alignment flat at one end, and wherein step k), of passively aligning said additional optical element, includes urging said additional optical element into contact with the alignment flat of said alignment member, thereby passively aligning the optical element to the microlens structure.

35. A method for fabricating a plurality of passively aligned microlens structures, comprising the steps of:

a) providing a master base substrate having a surface;
b) providing a plurality of first elongate cylindrical microlenses, each of said plurality of first elongate cylindrical microlenses having at least one elongate cylindrical optical surface;
c) providing a plurality of second elongate cylindrical microlenses each of said plurality of second elongate cylindrical microlenses having at least one elongate cylindrical optical surface;

d) forming a plurality of substantially parallel first alignment strips, each strip corresponding to a plurality of first alignment sites on said master base substrate surface, each of said first alignment strips being shaped and sized so that said plurality of first elongate microlenses may be urged into contact with, and thereby passively aligned to, said plurality of first alignment strips;

e) forming a plurality of substantially parallel second alignment strips,
  i) each second alignment strip being substantially parallel to said plurality of first alignment strips, each second alignment strip corresponding to a plurality of second alignment sites on said master base substrate surface,
  ii) each of said plurality of second alignment strips being separated from a corresponding first alignment strip by a proper optical distance, and
  iii) each of said plurality of second alignment strips, being shaped and sized so that said plurality of second elongate microlenses may be urged into contact with, and thereby passively aligned to, said plurality of second alignment strips;

f) urging said plurality of first elongate cylindrical microlenses into contact with, and passively aligned to, said first alignment strips;

g) affixing each of said plurality of first elongate cylindrical microlenses to said master base substrate at intermittent locations along the elongate dimensions of said first elongate cylindrical microlenses;

h) urging said plurality of second elongate cylindrical microlenses into contact with said second alignment strips, thereby separating said first elongate cylindrical microlenses from said second elongate cylindrical microlenses by a proper optical distance and correctly aligning said first elongate cylindrical microlenses with respect to said second elongate cylindrical microlenses;

i) affixing each of said plurality of second elongate cylindrical microlenses to said master base substrate at intermittent locations along the elongate dimensions of said second elongate cylindrical microlenses to complete formation of a microlens master template; and j) dicing said microlens master template into separate microlens structures, and
  thereby fabricating said microlens structure such that an optical axis is centered on and is perpendicular to the cylindrical optical surfaces of each of the first and second cylindrical microlenses,
  said optical axis being disposed in a plane parallel to said base substrate surface,
  said optical axis being perpendicular to said alignment sites on said base substrate surface, and
  whereby light traveling along said optical axis traverses each of said first and said second cylindrical microlens in series.

36. A method for fabricating a plurality of passively aligned microlens structures as in claim 35 comprising the further step k) of passively aligning said microlens structures with an additional optical element.

37. A method for fabricating a plurality of passively aligned microlens structures as in claim 35 wherein said steps d) and e) of forming a plurality of alignment strips comprises forming said alignment strips by creating recesses in the master base substrate.

38. A method for fabricating a plurality of passively aligned microlens structures as in claim 37 wherein said recesses in the master base substrate are created using wafer scale etching techniques.

39. A method for fabricating a plurality of passively aligned microlens structures as in claim 37 wherein said recesses in the master base substrate are created by using a saw to cut grooves in the master base substrate.

40. A method for fabricating a plurality of passively aligned microlens structures as in claim 37, wherein between steps e) and f), a further step of forming recessed passages which transect said first and second alignment strips to allow a light beam to pass through the microlenses of said microlens structures is conducted.

41. A method for fabricating a plurality of passively aligned microlens structures as in claim 35 wherein said steps d) and e) of forming a plurality of alignment strips comprises forming said alignment strips by creating mesas on the master base substrate, said mesas defining said alignment strips.

42. A method for fabricating a passively aligned microlens structure as in claim 36, wherein said step b) of providing a plurality of first elongate cylindrical microlenses includes providing said first elongate cylindrical microlenses wherein each of said first elongate microlenses each include an alignment member, said alignment member having an alignment flat at one end, and wherein step k), of passively aligning said additional optical element, includes urging said additional optical element into contact with the alignment flat of said alignment member, thereby passively aligning the optical element with the microlens structure.

43. A method for fabricating a plurality of microlens structures as in claim 35 wherein said steps f), g), h), and i) of urging and affixing said first and said second cylindrical microlenses is accomplished using automated devices.

44. A laser diode microlens system, comprising:
  a base substrate having a surface,
  the base substrate surface having a first alignment site, shaped and sized so that said first microlens may be urged into contact with, and thereby passively aligned to, said first alignment site,
  the base substrate surface having a second alignment site, shaped and sized so that said second microlens may be urged into contact with, and thereby passively aligned to, said second alignment site;
  a laser diode for producing an output beam, said output beam having an elliptical eccentricity;
  a first cylindrical microlens positioned at said first alignment site to receive said output beam, said first microlens altering the divergence of said elliptical output beam changing the eccentricity of said beam to a desired eccentricity, thereby creating an altered beam;
  a second cylindrical microlens positioned at said second alignment site substantially parallel with said first microlens to receive said altered beam, said second microlens for correcting astigmatism in said altered beam, thereby creating a corrected beam having reduced astigmatism; and
  an optical axis,
  said optical axis being centered on and being perpendicular to the cylindrical optical surfaces of each of the first and second cylindrical microlenses,
  said optical axis being disposed in a plane parallel to said base substrate surface,
  said optical axis being perpendicular to said alignment sites on said base substrate surface, and whereby said output beam, upon traveling along said optical axis, traverses each of said first and said second cylindrical microlens in series.

45. A laser diode microlens system as in claim 44 further comprising:

a base substrate;

said base substrate having a first alignment site and a second alignment site;

said first cylindrical microlens being fitted into said first alignment site; said second cylindrical microlens being fitted into said second alignment site; and said laser diode being positioned on said base substrate such that said laser diode is in operative combination with said first microlens and said second microlens.

* * * * *

UNITED STATES PATENT AND TRADEMARK OFFICE
CERTIFICATE OF CORRECTION

PATENT NO : 6,160,672
DATED    : DECEMBER 12, 2000
INVENTOR(S): BENNY L. CHAN and STEPHEN L. KWIATKOWSKI It is certified that error appears in the above-identified patent and that said Letters Patent is hereby corrected as shown below:

In Column 6, Line 12: please delete the space between the "t" and "s" in the word effects.

In Column 6, Line 22: please delete the space between the "o" and the "n" in the work configuration.

In Column 11, Line 28 please delete the [ ) ] and replace with - -0 - - in the number 1170, after the word devices.

Signed and Sealed this

Twenty-ninth Day of May, 2001

Attest:

NICHOLAS P. GODICI

Attesting Officer

Acting Director of the United States Patent and Trademark Office